(12) United States Patent
Edmonds

(10) Patent No.: US 8,371,217 B2
(45) Date of Patent: Feb. 12, 2013

(54) SCREEN PRINTING HEAD, SYSTEM AND METHOD

(75) Inventor: Andrew Edmonds, Poole (GB)

(73) Assignee: DEK International GmbH, Zurich (CH)

( * ) Notice: Subject to any disclaimer, the term of this patent is extended or adjusted under 35 U.S.C. 154(b) by 651 days.

(21) Appl. No.: 12/296,768

(22) PCT Filed: Apr. 5, 2007

(86) PCT No.: PCT/GB2007/001299
§ 371 (c)(1),
(2), (4) Date: Nov. 30, 2009

(87) PCT Pub. No.: WO2007/128981
PCT Pub. Date: Nov. 15, 2007

(65) Prior Publication Data
US 2010/0139509 A1   Jun. 10, 2010

(30) Foreign Application Priority Data
Apr. 10, 2006 (GB) .................. 0607118.7

(51) Int. Cl.
*B41F 15/40* (2006.01)
*B41F 15/42* (2006.01)
*B41L 13/18* (2006.01)
(52) U.S. Cl. ........................... 101/123; 101/129
(58) Field of Classification Search .................. 101/123, 101/114, 129; 118/406, 410
See application file for complete search history.

(56) References Cited

U.S. PATENT DOCUMENTS
4,622,239 A * 11/1986 Schoenthaler et al. ........... 427/8
(Continued)

FOREIGN PATENT DOCUMENTS
AT   360955   2/1991
DE   4417633   12/1994
(Continued)

OTHER PUBLICATIONS
International Preliminary Report on Patentability for corresponding application No. PCT/GB2007/01299 dated Aug. 11, 2008.

*Primary Examiner* — Judy Nguyen
*Assistant Examiner* — Leo T Hinze
(74) *Attorney, Agent, or Firm* — Renner, Otto, Boisselle & Sklar, LLP

(57) ABSTRACT

A screen printing head which, in a printing operation, is displaceable in a first direction over a surface of a workpiece to print deposits of a print medium on the workpiece, the screen printing head comprising: a print head assembly comprising a print unit comprising a main body including a print medium, cavity, which in use contains print medium, and a delivery aperture, which is in fluid communication with the print medium cavity and through which print medium is in use delivered from the print medium cavity to the surface of the workpiece, and a rotatable unit which is disposed in the print medium cavity of the main body and rotatable to displace print medium as contained in the print medium cavity; and a drive unit for rotating the rotatable unit such as to displace print medium as contained in the print medium cavity, wherein the drive unit is operative to rotate the rotatable unit to apply a force to the print medium at the delivery aperture in the main body in a second direction which is opposite to the first direction of displacement of the screen printing head.

28 Claims, 11 Drawing Sheets

U.S. PATENT DOCUMENTS

| | | | |
|---|---|---|---|
| 5,144,892 A * | 9/1992 | Tupek et al. | 101/363 |
| 5,328,520 A | 7/1994 | Itagaki | |
| 5,452,655 A | 9/1995 | Tani | |
| 5,925,187 A * | 7/1999 | Freeman et al. | 118/667 |
| 6,591,745 B2 * | 7/2003 | Miyahara et al. | 101/123 |
| 6,746,710 B1 * | 6/2004 | Lambert | 427/96.2 |
| 7,096,781 B2 * | 8/2006 | Katano et al. | 101/123 |

FOREIGN PATENT DOCUMENTS

| | | |
|---|---|---|
| FR | 2687845 | 8/1993 |
| FR | 2754473 | 4/1998 |
| JP | 2001232758 A * | 8/2001 |
| JP | 200372027 | 9/2001 |
| JP | 2001347635 | 12/2001 |
| JP | 200498546 | 9/2002 |
| WO | 98/16387 | 4/1998 |
| WO | 01/05592 | 1/2001 |

* cited by examiner

SCREEN PRINTING HEAD, SYSTEM AND METHOD

The present invention relates to a screen printing head for printing a print medium onto a workpiece, typically a viscous product, such as a solder paste, onto a substrate, such as a printed circuit board, through a printing screen which includes a pattern of printing apertures corresponding to a pattern of deposits to be printed on the substrate, a system incorporating the same, and a screen printing method.

Examples of such screen printing heads are disclosed in the applicant's earlier WO-A-1998/016387 and WO-A-2001/005592, where these screen printing heads are sold under the ProFlow® brand.

The screen printing head of WO-A-2001/005592 is illustrated in FIG. 1, and the operation of this screen printing head in filling a printing aperture of a printing screen is illustrated in FIG. 2.

The screen printing head comprises an elongate main body 30, and first and second inwardly and downwardly directed wiper blades 31, 32 which are clamped to the main body 30 and maintained in contact with a printing screen 34, which includes a pattern of printing apertures 36 and is located above a workpiece 38, such as a printed circuit board, onto which deposits of a print medium 56 are to be printed.

The main body 30 includes first and second lobe members 42, 44 between which an outlet opening 46 is defined, and first and second chambers 48, 50 which are in fluid communication through the outlet opening 46. One, the upper, of the chambers 48 provides a reservoir for containing a print medium 56 and is defined in part by a flexible diaphragm 58 which is in use acted upon to drive print medium 56 under pressure into the other, lower chamber 50. The lower chamber 50 provides first and second circulation zones 60, 61 in and through which print medium 56 is circulated.

The screen printing head further comprises a flow director 63 which is disposed in the lower chamber 50 adjacent the outlet opening 46. The flow director 63 comprises first and second vanes 64, 66 which each extend a distance parallel to the lower surface of respective ones of the first and second lobe members 42, 44 adjacent the outlet opening 46, such as to define passages 67, 68 therebetween, and downwardly to define a nozzle 69 therebetween which is spaced rearwardly from the plane defined by the lower edges of the wiper blades 31, 32, such as to allow for a flow of the print medium 56 therebeneath. With this configuration, the printing head is effectively divided into four sections as defined by the upper chamber 48, the first and second circulation zones 60, 61 and the internal space of the flow director 63.

During printing, as illustrated in FIG. 2, the screen printing head is moved over the printing screen 34, while a first, downward force F1 is applied by the diaphragm 58 to the contained print medium 56. This movement of the screen printing head, from left to right as illustrated, creates a second, horizontal force F2 on the contained print medium 56, which, together with the downward force F1, creates a resultant force F3 which is inclined to the surface of the printing screen 34 and acts to fill the printing aperture 36 therein, as represented by arrow A, with the forward, right-hand end of the printing aperture 36 filling first and the printing aperture 36 then being back filled to the rearward, left-hand end.

This screen printing head has operated very successfully to date, but new applications, notably in the electronics industry, require printing speeds which can cause incomplete filling of the printing apertures 36. This increased printing speed causes the print medium 56 to be subjected to an increased horizontal force F2, which leads to slower filling of the printing apertures 36 as a consequence of the resultant force F3 having a smaller vertical force component, and also leads to the screen printing head being located over a printing aperture 36 for a decreased period of time. It has been found that printing speeds in excess of about 100 mm/s can result in incomplete filling of printing apertures 36, leading, as represented in FIG. 3, to a partially-printed deposit D1, which can be compared to a complete deposit D2.

In addition to the requirement for increased printing speeds, new applications are requiring the printing of very precise amounts of material deposits.

One such application in the electronics industry is known as "Pin-in-Paste", which is represented in FIGS. 4(a) to (d). FIG. 4(a) illustrates a section of a printing screen 71, which includes a printing aperture 73, disposed over a section of a printed circuit board 75, which includes a plated through hole 77. In a first operation, as illustrated in FIG. 4(b), a screen printing head is moved over the surface of the printing screen 71 to deposit solder paste 79 in the through hole 77 of the printed circuit board 75 and the printing aperture 73 in the printing screen 71. In a second operation, as illustrated in FIG. 4(c), the printing screen 71 is removed from the surface of the printed circuit board 75. In a third and final operation, a pin 81 is inserted in the through hole 77 of the printed circuit board 75 and the solder paste is reflowed to provide solder filets 83, 83 on both sides of the printed circuit board 75.

The formation of these solder filets 83, 83 requires a precise amount of solder paste 79 to be printed through the through hole 77 in the printed circuit board 75, which is very difficult to achieve with the existing screen printing head, not least because the through hole 77 in the printing circuit board 75 can be relatively deep and the faster printing speeds, which are now being demanded, make the filling of such deeper through holes 77 particularly problematic, since, as described hereinabove, the vertical force component of the resultant force F3 is smaller with increased printing speeds. These problems associated with the existing screen printing head are compounded by the fact that solder paste has such a variability in consistency that achieving reliable filling can be virtually impossible to achieve.

It is thus an aim of the present invention to provide an alternative screen printing head for printing a print medium onto a workpiece, which at least in one embodiment allows for the more reliable filling of deeper structures in workpieces.

In one aspect the present invention provides a screen printing head which, in a printing operation, is displaceable in a first direction over a surface of a workpiece to print deposits of a print medium on the workpiece, the screen printing head comprising: a print head assembly comprising a print unit comprising a main body including a print medium cavity, which in use contains a print medium, and a delivery aperture, which is in fluid communication with the print medium cavity and through which print medium is in use delivered from the print medium cavity to the surface of the workpiece, and a rotatable unit which is disposed in the print medium cavity of the main body and rotatable to displace print medium as contained in the print medium cavity; and a drive unit for rotating the rotatable unit such as to displace print medium as contained in the print medium cavity, wherein the drive unit is operable to rotate the rotatable unit to apply a force to the print medium at the delivery aperture in the main body in a second direction which is opposite to the first direction of displacement of the screen printing head.

In one embodiment the print medium cavity comprises an elongate cavity.

In one embodiment the delivery aperture comprises an elongate aperture.

In one embodiment the print medium cavity comprises a first chamber which opens to the delivery aperture and in which the rotatable unit is disposed, and a second chamber which is fluidly connected to the first chamber, such as to allow for print medium to be supplied from the second chamber to the first chamber.

In one embodiment the first chamber includes an upper surface of arcuate section.

In one embodiment the arcuate section is of part-circular section.

In one embodiment the second chamber is fluidly connected to the upper surface of the first chamber.

In one embodiment the second chamber is of rectangular section.

In one embodiment the rotatable unit comprises a hollow body member which includes an inner cavity and a plurality of transfer apertures which fluidly connect the inner cavity with the print medium cavity.

In one embodiment the body member includes a perforated cylindrical member.

In one embodiment the cylindrical member comprises a mesh which includes an array of transfer apertures over the surface thereof.

In one embodiment the body member includes a central body which extends internally within the cylindrical member, such that the inner cavity is an annular cavity.

In one embodiment the annular cavity is substantially of circular section.

In one embodiment the main body includes a charging port through which the print medium cavity is in use charged with print medium.

In one embodiment the print unit further comprises a valve for selectively opening and closing the charging port.

In one embodiment the print unit further comprises a pressure application unit which is operative to apply a pressure to the print medium as contained in the print medium cavity.

In one embodiment the pressure application unit is operative to apply a pressure to the print medium in the direction of the delivery aperture in the main body.

In one embodiment the pressure application unit comprises a piston assembly.

In one embodiment the piston assembly comprises a piston member which is movably disposed in the print medium cavity.

In one embodiment the piston member is movably disposed in the second chamber of the print medium cavity.

In one embodiment the piston assembly comprises at least one actuator unit which is operative to apply a predeterminable force to the piston member.

In one embodiment the drive unit comprises a drive motor for rotating the rotatable unit.

In one embodiment the drive unit further comprises a gear assembly which couples the drive motor to the rotatable unit.

In one embodiment the rotatable unit is rotated at such a speed that the force as applied to the print medium at the delivery aperture in the main body in the second direction is substantially equal to a force as applied to the print medium by displacement of the screen printing head in the first direction.

In one embodiment the print unit comprises first and second wiper blades which are disposed in opposed relation to opposite sides of the delivery aperture in the main body.

In one embodiment the print head assembly comprises at least one support bracket which is attached to the print unit and by which the print head assembly is mounted to a screen printing machine.

In one embodiment the print unit is pivotally coupled to the at least one support bracket, such as to allow for alignment of the print unit.

In one embodiment the at least one support bracket comprises a clamping member for clamping the at least one support bracket to a mounting frame.

In one embodiment the print head assembly comprises first and second support brackets which are attached to respective ends of the print unit.

In one embodiment the screen printing head further comprises: a mounting frame to which the print head assembly is mounted.

In one embodiment the mounting frame includes a fixing for attaching the mounting frame to a carriage of a screen printing machine.

In one embodiment the mounting frame includes a plurality of mounting apertures to which respective ones of the support brackets are engaged.

In one embodiment the mounting frame includes an alignment member which is operative to engage the print unit such as to provide for alignment of the same relative to the mounting frame.

In one embodiment the alignment member comprises a cam member.

In one embodiment the screen printing head further comprises: a feed mechanism which is operative to charge the print medium cavity at spaced locations.

In one embodiment the feed mechanism is operative to charge the print medium cavity at spaced locations along the length thereof.

In one embodiment the main body includes a plurality of transfer ports which open at spaced locations into the print medium cavity and are fluidly connected to the feed mechanism.

In one embodiment the main body includes an elongate feed cavity which is in fluid communication with the transfer ports, and the feed mechanism comprises a feed element which is disposed in the feed cavity and operative to feed print medium through the transfer ports in filling the print medium cavity.

In one embodiment the feed cavity is defined in part by a separable elongate member.

In one embodiment the feed cavity comprises a substantially cylindrical channel.

In one embodiment the feed element comprises a feed screw which is operative to feed print medium through the transfer ports on rotation of the same.

In one embodiment the feed mechanism further comprises a feed drive unit for driving the feed element to charge the print medium cavity with print medium.

In one embodiment the feed drive unit comprises a drive motor for driving the feed element.

In one embodiment the feed drive unit further comprises a gear assembly which couples the drive motor to the feed element.

In one embodiment the screen printing head is reciprocatingly displaceable over the surface of the workpiece in the printing operation.

In another aspect the present invention provides a screen printing head system, comprising: the above-described screen printing head; and a control unit for controlling the drive unit such as to rotate the rotatable unit at a predeterminable speed.

In a further aspect the present invention provides a method of printing deposits of a print medium on a workpiece using a screen printing head, the method comprising the steps of: providing a screen printing head which comprises a print head assembly, the print head assembly comprising a print unit which comprises a main body including a print medium cavity and a delivery aperture, which is in fluid communication with the print medium cavity, and a rotatable unit which is disposed in the print medium cavity of the main body and rotatable to displace print medium as contained in the print medium cavity; displacing the screen printing head in a first direction over a workpiece in a printing operation; and rotating the rotatable unit such as to displace print medium as contained in the print medium cavity, wherein the rotatable unit is rotated such as to apply a force to the print medium at the delivery aperture in a second direction which is opposite to the first direction of displacement of the screen printing head.

In one embodiment the print medium cavity comprises an elongate cavity.

In one embodiment the delivery aperture comprises an elongate aperture.

In one embodiment the print medium cavity comprises a first chamber which opens to the delivery aperture and in which the rotatable unit is disposed, and a second chamber which is fluidly connected to the first chamber, such as to allow for print medium to be supplied from the second chamber to the first chamber.

In one embodiment the first chamber includes an upper surface of arcuate section.

In one embodiment the arcuate section is of part-circular section.

In one embodiment the second chamber is fluidly connected to the upper surface of the first chamber.

In one embodiment the second chamber is of rectangular section.

In one embodiment the rotatable unit comprises a hollow body member which includes an inner cavity and a plurality of transfer apertures which fluidly connect the inner cavity with the print medium cavity.

In one embodiment the body member includes a perforated cylindrical member.

In one embodiment the cylindrical member comprises a mesh which includes an array of transfer apertures over the surface thereof.

In one embodiment the body member includes a central body which extends internally within the cylindrical member, such that the inner cavity is an annular cavity.

In one embodiment the annular cavity is substantially of circular section.

In one embodiment the method further comprises the step of: charging the print medium cavity with print medium.

In one embodiment the rotatable unit is stationary during the step of charging the print medium cavity.

In another embodiment the rotatable unit is rotated during the step of charging the print medium cavity.

In one embodiment the method further comprises the step of: applying a pressure to the print medium as contained in the print medium cavity.

In one embodiment the pressure is applied to the print medium in the direction of the delivery aperture in the main body.

In one embodiment the pressure application step comprises the step of: moving a piston member in the print medium cavity to apply a pressure to the print medium in the print medium cavity.

In one embodiment the piston member is disposed in the second chamber of the print medium cavity.

In one embodiment the print unit comprises first and second wiper blades which are disposed in opposed relation to opposite sides of the delivery aperture in the main body.

In one embodiment the rotatable unit is rotated at such a speed that the force as applied to the print medium at the delivery aperture in the main body in the second direction is substantially equal to a force as applied to the print medium by displacement of the screen printing head in the first direction.

In one embodiment the print head assembly comprises at least one support bracket which is attached to the print unit and by which the print head assembly is mounted to a screen printing machine.

In one embodiment the print unit is pivotally coupled to the at least one support bracket, and further comprising the step of: pivoting the print unit to the at least one support bracket, such as to align the print unit.

In one embodiment the at least one support bracket comprises a clamping member for clamping the at least one support bracket to a mounting frame.

In one embodiment the print head assembly comprises first and second support brackets which are attached to respective ends of the print unit.

In one embodiment the screen printing head further comprises a mounting frame to which the print head assembly is mounted.

In one embodiment the mounting frame includes a fixing for attaching the mounting frame to a carriage of a screen printing machine.

In one embodiment the mounting frame includes a plurality of mounting apertures to which respective ones of the support brackets are engaged.

In one embodiment the mounting frame includes an alignment member which is operative to engage the print unit such as to provide for alignment of the same relative to the mounting frame.

In one embodiment the alignment member comprises a cam member.

In one embodiment the print head assembly further comprises a feed mechanism which is operative to charge the print medium cavity with print medium at spaced locations, and the method further comprises the step of: operating the feed mechanism to charge the print medium cavity with print medium at spaced locations.

In one embodiment the feed mechanism is operative to charge the print medium cavity at spaced locations along the length thereof.

In one embodiment the main body includes a plurality of transfer ports which open at spaced locations into the print medium cavity and are fluidly connected to the feed mechanism.

In one embodiment the main body includes an elongate feed cavity which is in fluid communication with the transfer ports, and the feed mechanism comprises a feed element which is disposed in the feed cavity and operative to feed print medium through the transfer ports in filling the print medium cavity.

In one embodiment the feed cavity is defined in part by a separable elongate member.

In one embodiment the feed cavity comprises a substantially cylindrical channel.

In one embodiment the feed element comprises a feed screw, and the feed mechanism operating step comprises the step of: rotating the feed screw to feed print medium through the transfer ports.

In one embodiment the method further comprises the step of: reciprocatingly displacing wherein the screen printing head in one of two opposite directions over the surface of the workpiece in the printing operation.

Preferred embodiments of the present invention will now be described hereinbelow by way of example only with reference to the accompanying drawings, in which.

Figure 1:
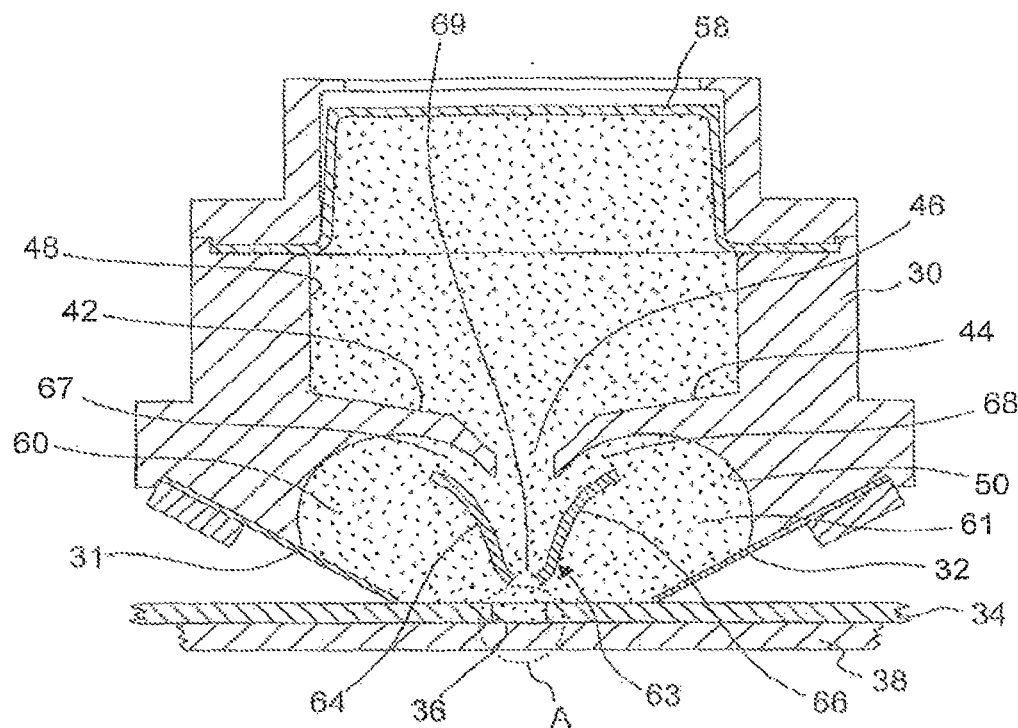
FIG. 1 illustrates a sectional view of a prior art screen printing head.
Figure 2:
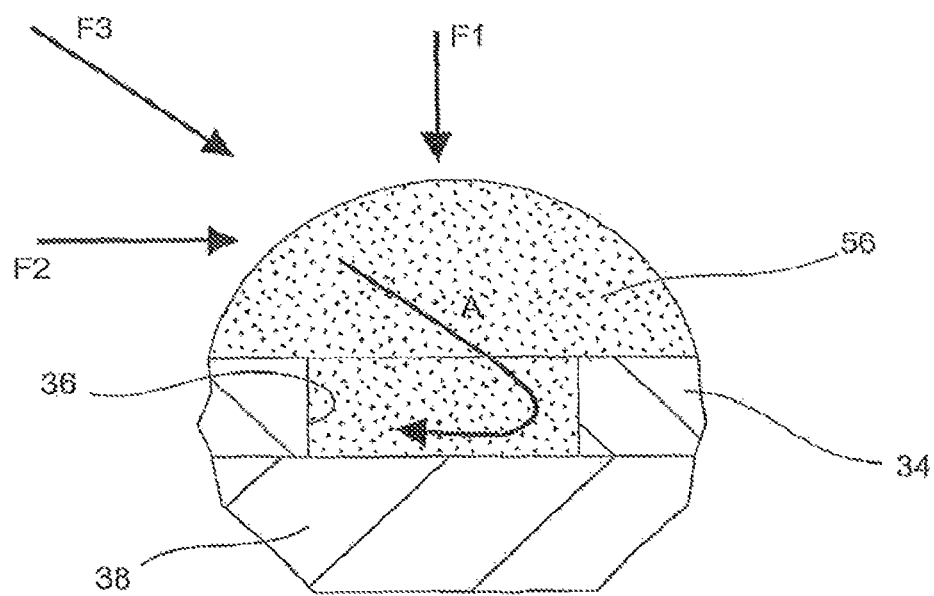
FIG. 2 illustrates an enlarged view of detail A in FIG. 1, where illustrating the operation of the screen printing head of FIG. 1 in filling a printing aperture of a printing screen in a screen printing operation.
Figure 3:
FIG. 3 represents incomplete and complete deposits D1, D2 of a print medium as printed on a substrate through a printing screen.
Figure 4A:
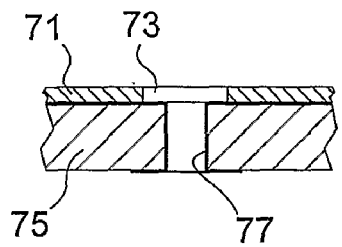
Figure 4B:
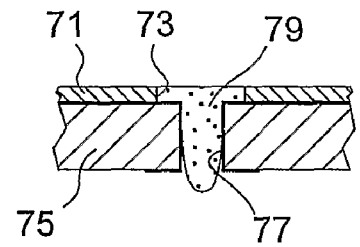
Figure 4C:
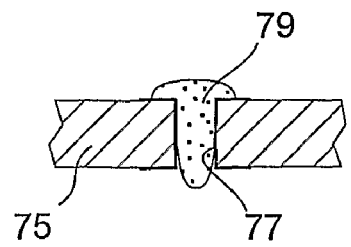
Figure 4D:
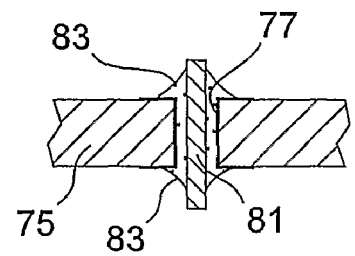
Figure 5:
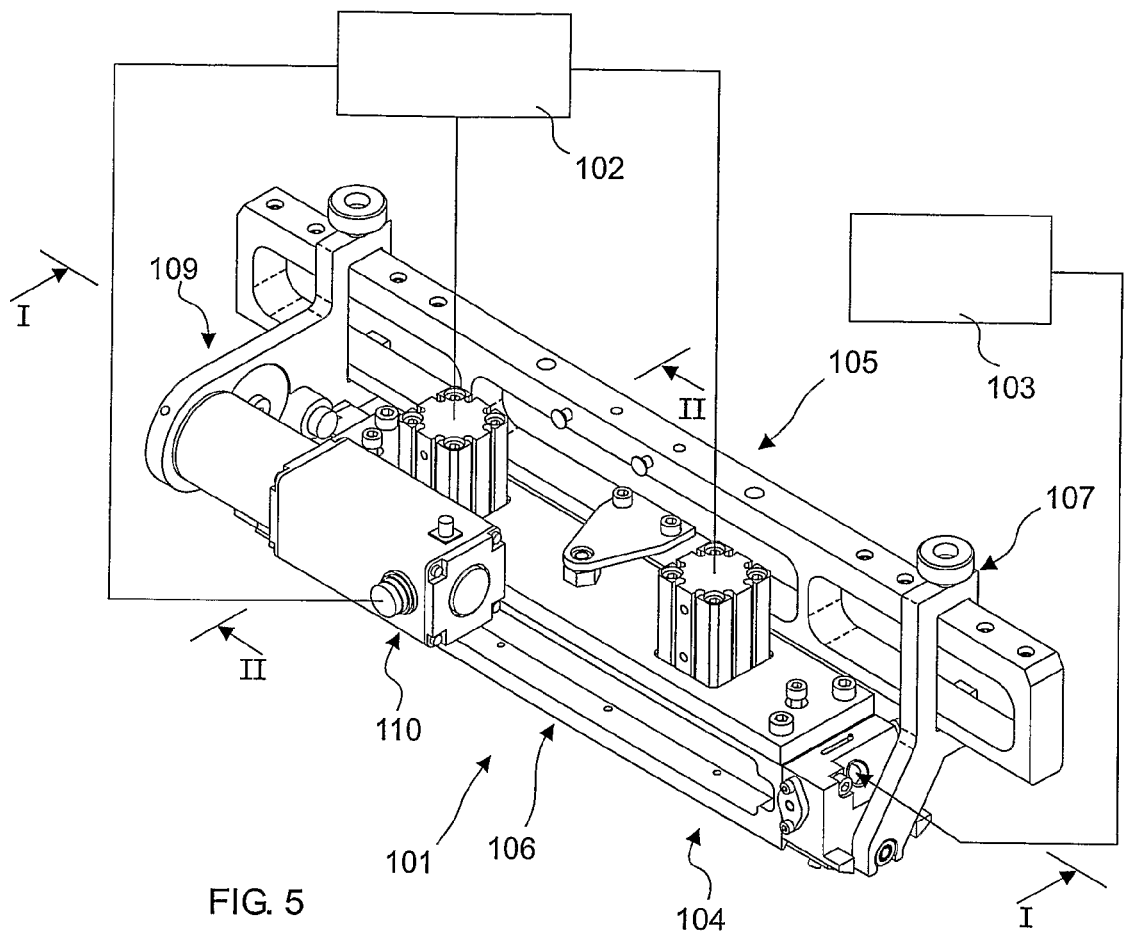
Figure 6:
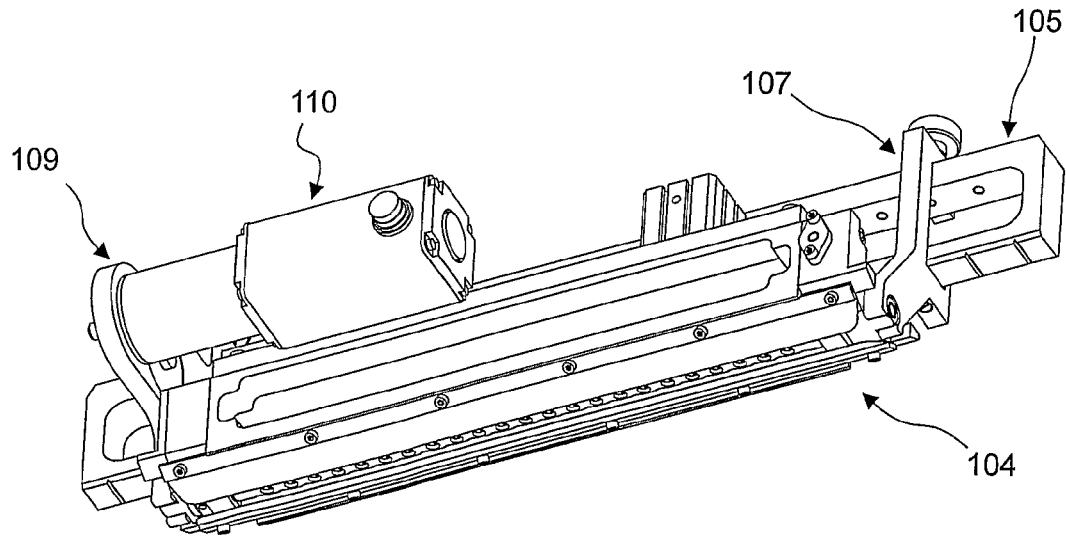
Figure 7:
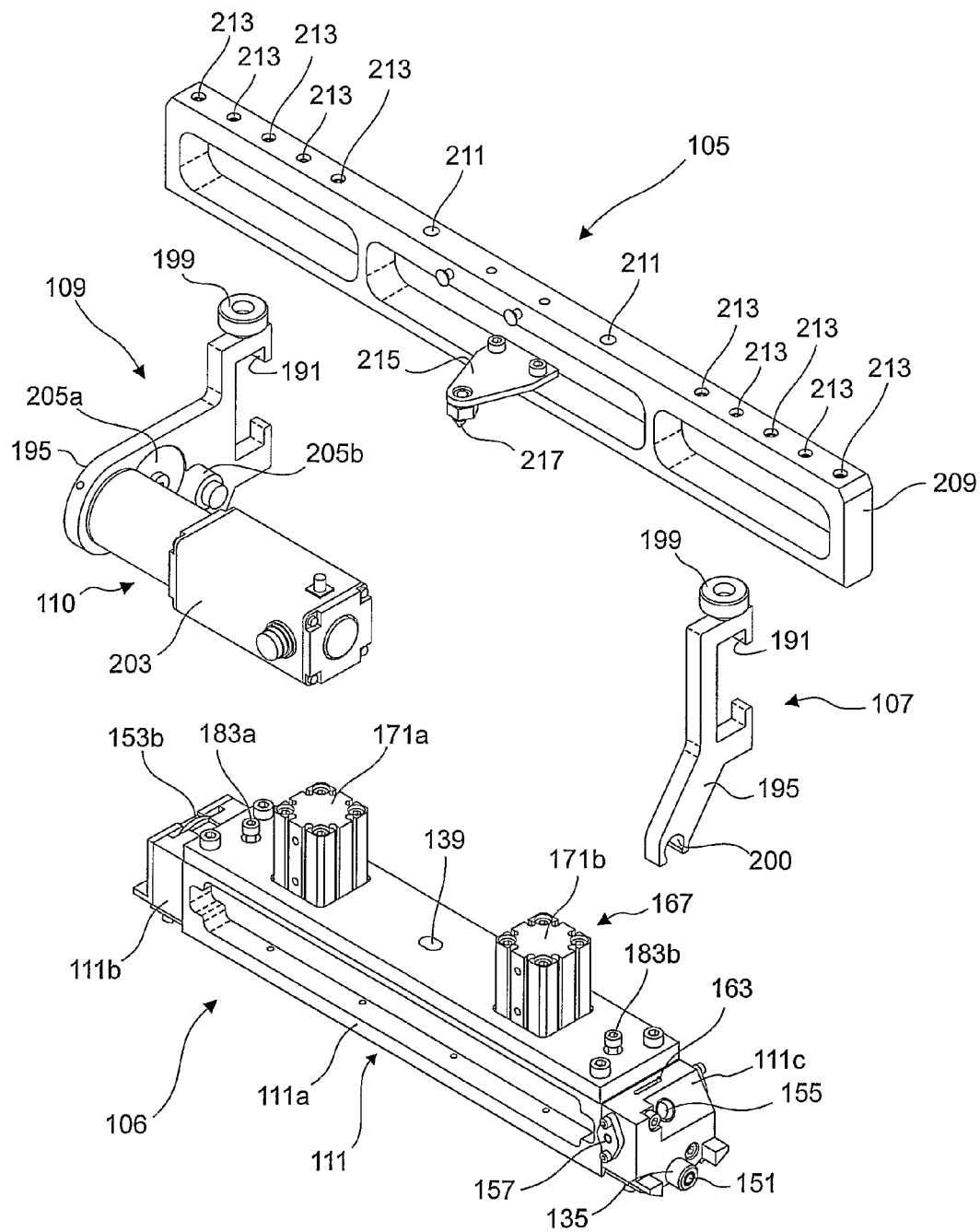
Figure 8:
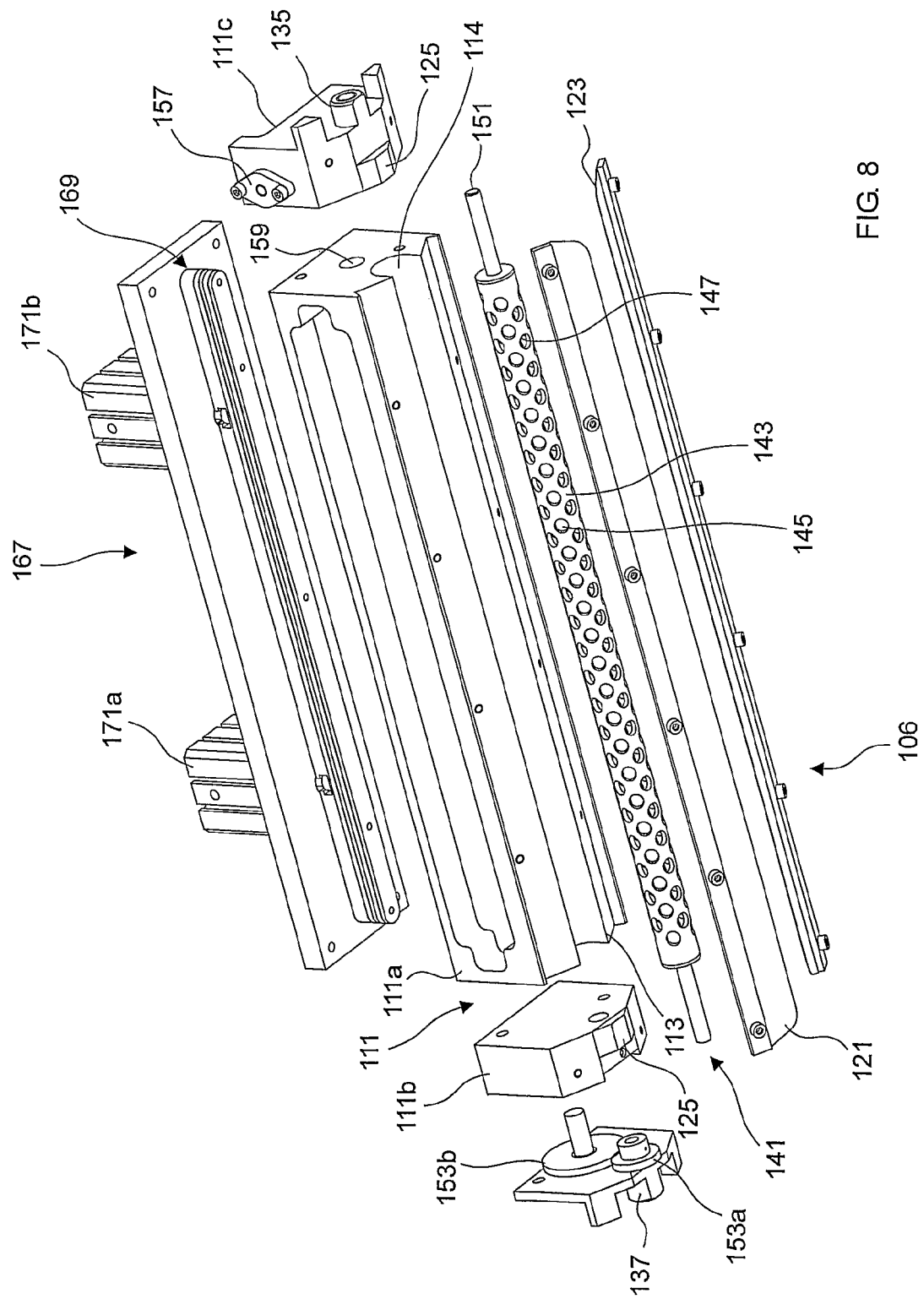
Figure 9:
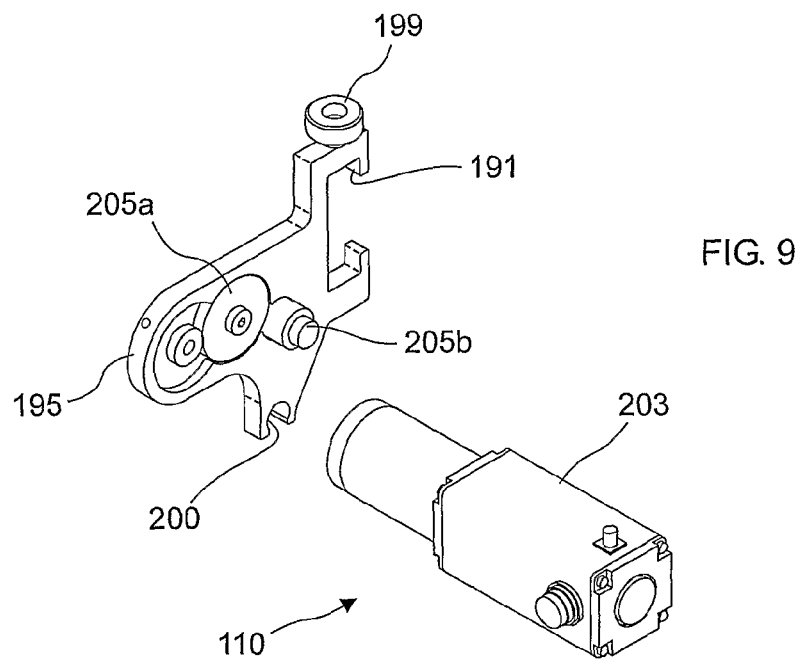
Figure 11:
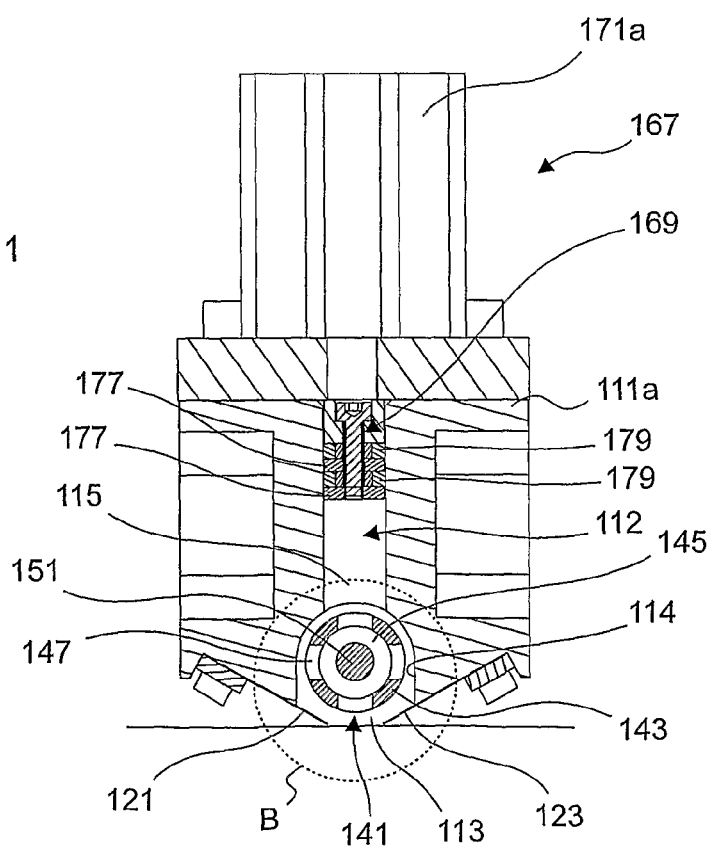
Figure 10:
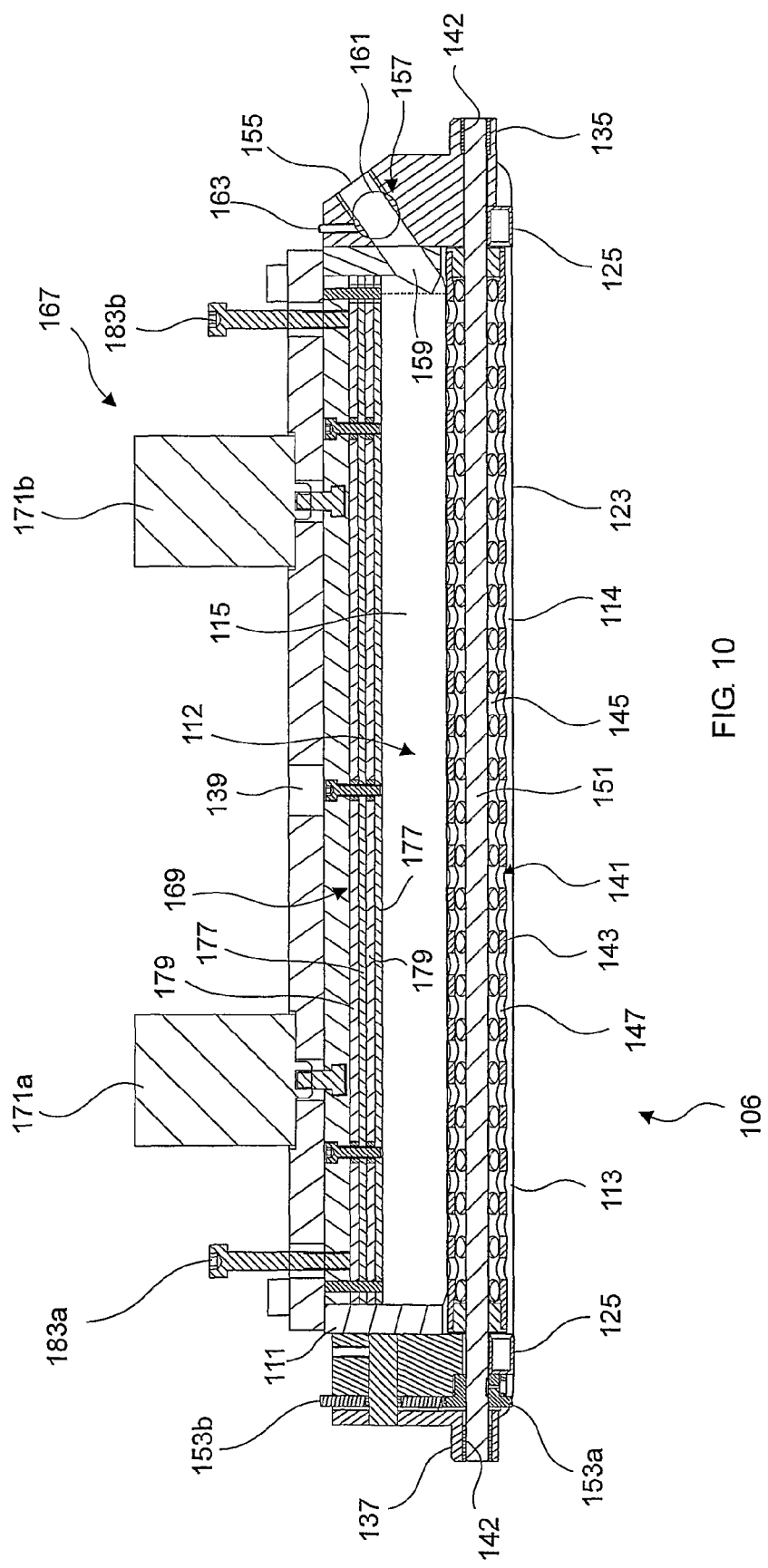
Figure 12:
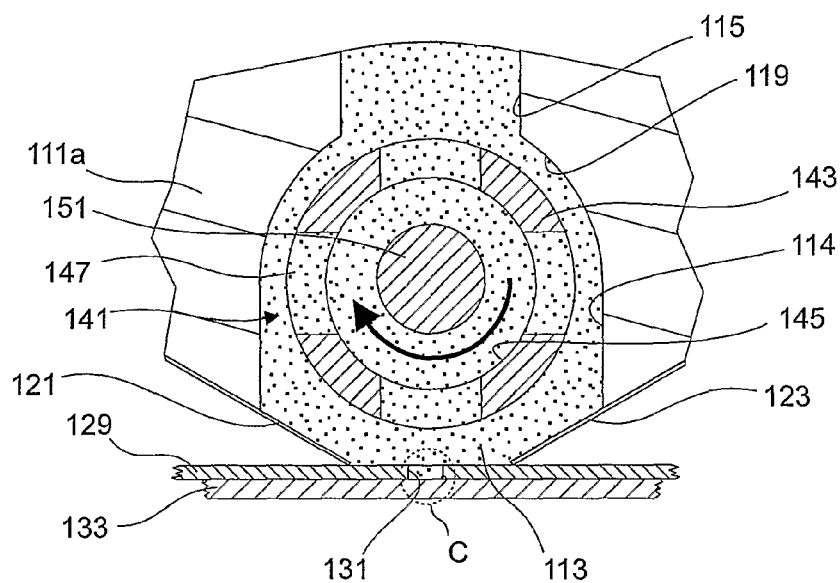
Figure 13:
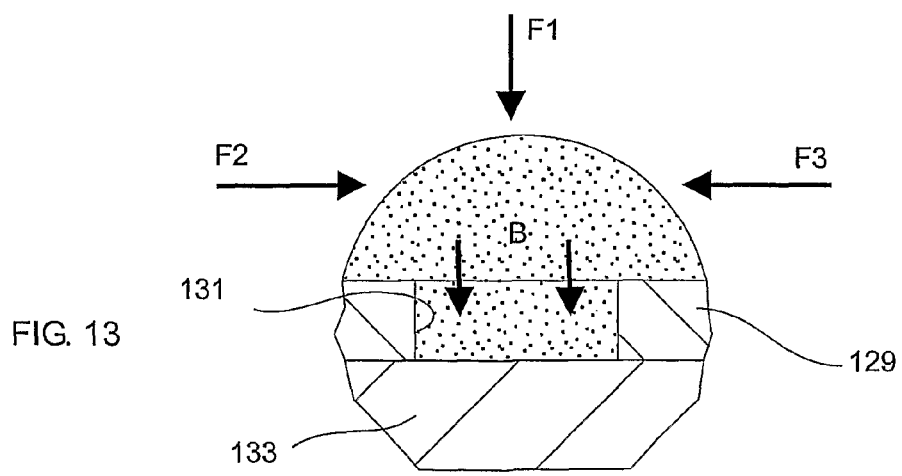
Figure 14:
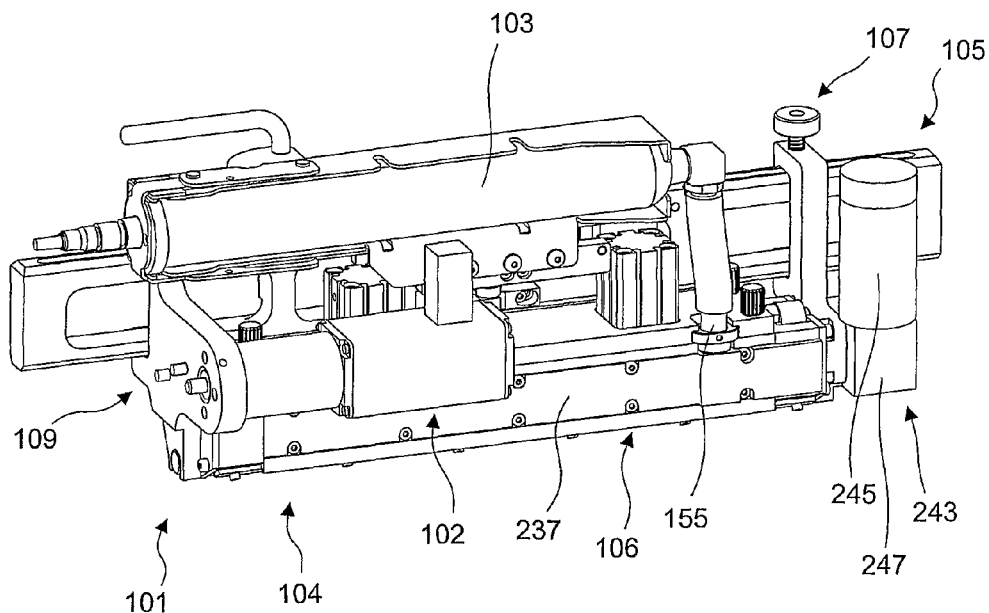
Figure 15:
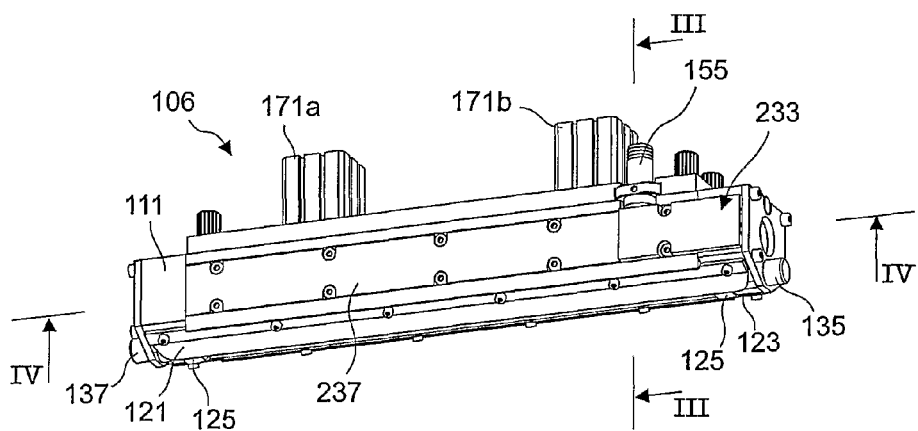
Figure 16:
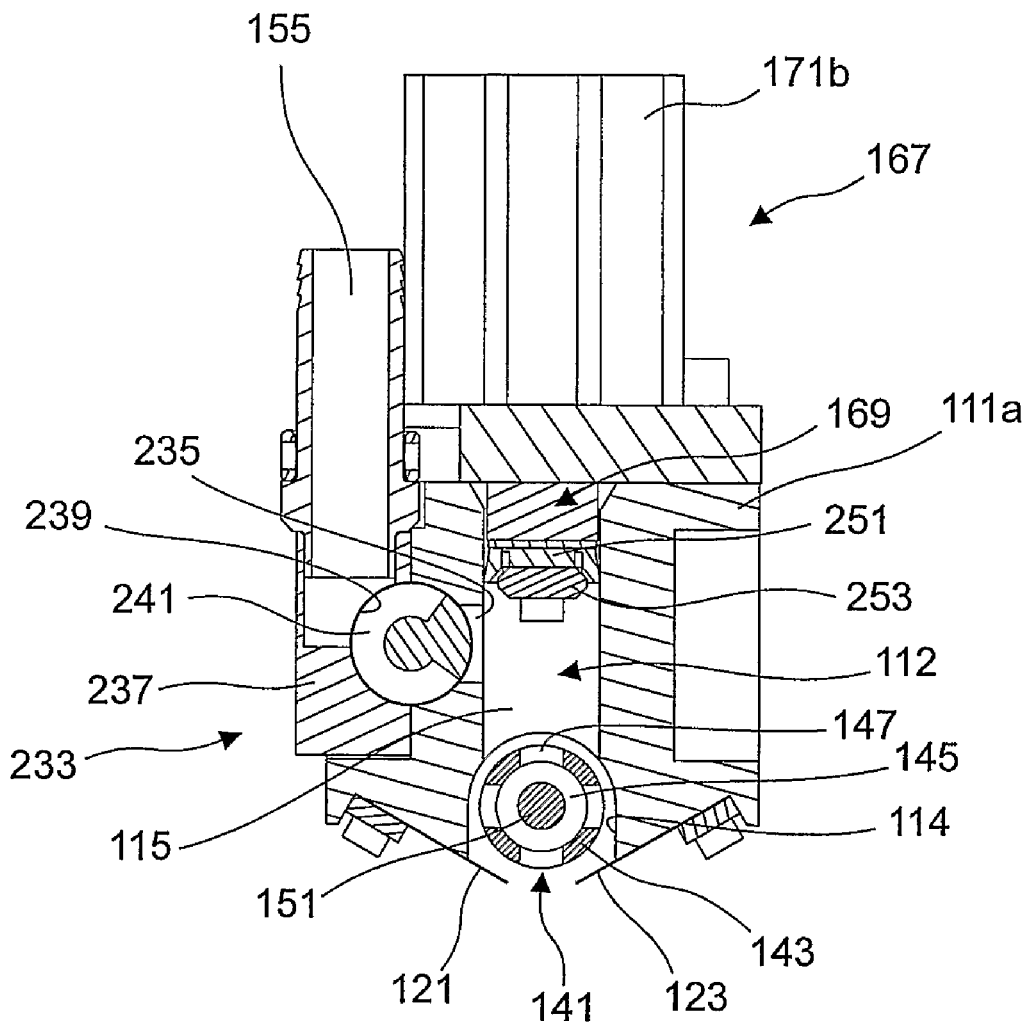
Figure 17:
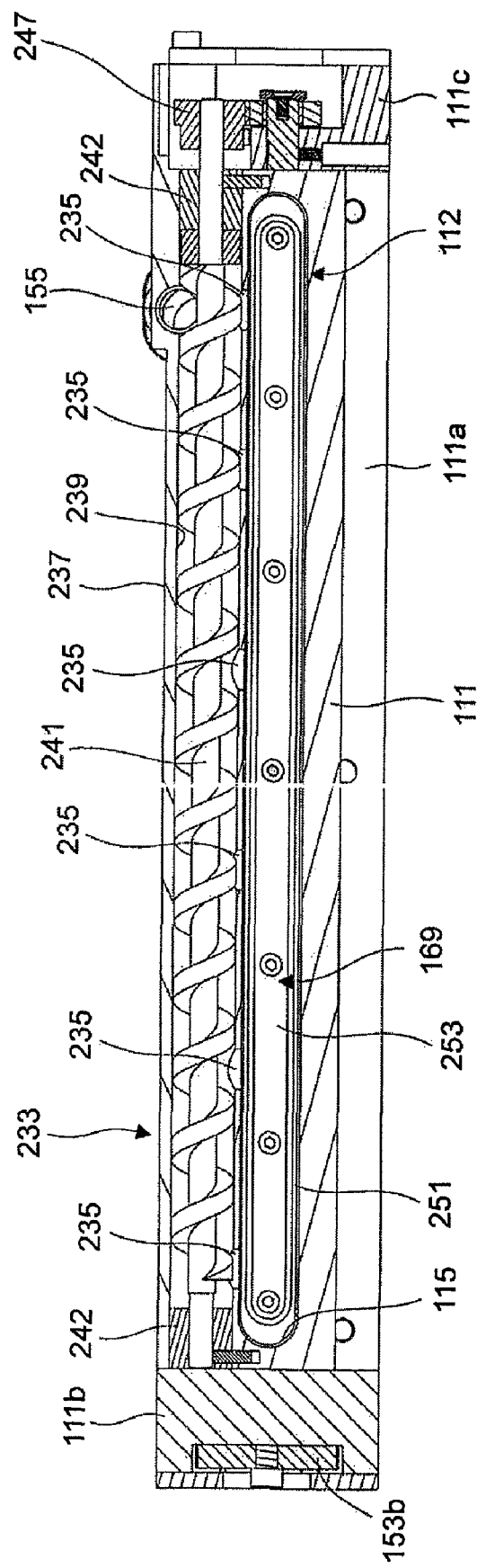

FIGS. 4(a) to (d) illustrate the fabrication steps in a "Pin-in-Paste" process;

FIG. 5 illustrates a screen printing system in accordance with a preferred embodiment of the present invention, illustrating a perspective view from one side and above of a screen printing head in accordance with a preferred embodiment of the present invention;

FIG. 6 illustrates a perspective view from the one side and below of the screen printing head of FIG. 5;

FIG. 7 illustrates a part-exploded perspective view of the screen printing head of FIG. 5;

FIG. 8 illustrates a part-exploded perspective view of the print unit of the screen printing head of FIG. 5;

FIG. 9 illustrates a part-exploded perspective view of the drive bracket and the drive unit of the screen printing head of FIG. 5;

FIG. 10 illustrates a longitudinal sectional view (along section I-I in FIG. 5) of the print unit of the screen printing head of FIG. 5;

FIG. 11 illustrates a lateral sectional view (along section II-II in FIG. 5) of the print unit of the screen printing head of FIG. 5;

FIG. 12 illustrates an enlarged view of detail B in FIG. 11;

FIG. 13 illustrates an enlarged view of detail C in FIG. 12;

FIG. 14 illustrates a perspective view from the one side and above of a modified screen printing head for use in the screen printing system of FIG. 5;

FIG. 15 illustrates a perspective view from the one side and below of the print unit of the screen printing head of FIG. 14;

FIG. 16 illustrates a lateral sectional view (along section in FIG. 15) of the print unit of the screen printing head of FIG. 15; and FIG. 17 illustrates a longitudinal sectional view (along section IV-IV in FIG. 15) of the print unit of the screen printing head of FIG. 15.

The screen printing system comprises a screen printing head 101, a control unit 102 which is operative to control the operation of the screen printing head 101, and a print medium supply 103 which is operative to charge the screen printing head 101 with print medium.

The screen printing head 101, in this embodiment an elongate head, comprises a print head assembly 104 and a support member 105 to which the print head assembly 104 is mounted.

The print head assembly 104 comprises a print unit 106, in this embodiment an elongate unit, a first support bracket 107 which is attached to the support member 105 and one end of the print unit 106, a second support bracket 109, as a drive bracket, which is attached to the support member 105 and the other end of the print unit 106, and a drive unit 110 for driving a rotatable unit 141 within the print unit 106, as will be described in more detail hereinbelow.

The print unit 106 comprises a main body 111, in this embodiment an elongate body, which includes a print medium cavity 112, in this embodiment an elongate cavity extending along the length of the main body 111, which contains a print medium, and a delivery aperture 113 at a lower surface of the main body 111, in this embodiment an elongate aperture extending along the length of the main body 111, which is in fluid communication with the print medium cavity 112 and through which print medium is delivered from the print medium cavity 112.

In this embodiment the main body 111 comprises a main body element 111a and first and second end cap elements 111b, 111c, which are disposed to the opposite ends of the main body element 111a.

In this embodiment the print medium cavity 112 comprises a first, lower chamber 114 which opens to the delivery aperture 113, and a second, upper chamber 115 which is fluidly connected to the lower chamber 114, such as to allow print medium to be supplied from the upper chamber 115 to the lower chamber 114, as will be described in more detail hereinbelow.

In this embodiment the lower chamber 114 includes an upper surface 119 of arcuate section, here of part-circular section, to which the upper chamber 115 is fluidly connected.

In this embodiment the upper chamber 115 is of rectangular section and includes parallel side walls which provide for sealing engagement with a piston member 169 of a piston assembly 167, as will be described in more detail hereinbelow.

The print unit 106 further comprises first and second inwardly and downwardly directed wiper blades 121, 123 which are disposed in opposed relation along opposite sides of the delivery aperture 113 in the main body 111 and clamped to the main body 111, in this embodiment by respective clamping plates and screws, and sealing members 125, 125 which are disposed to the opposite ends of the main body 111 and sealingly engage the respective ends of the wiper blades 121, 123, such as to prevent the escape of print medium beyond the ends of the wiper blades 121, 123. As illustrated in FIG. 12, the wiper blades 121, 123 are in use maintained in sealing contact with a printing screen 129, which includes a plurality of printing apertures 131 and is located above a workpiece 133, in this embodiment a printed circuit board, to which deposits of print medium are to be printed. In this embodiment the print unit 106 is symmetrically arranged about the longitudinal axis thereof such as to be moveable bi-directionally.

The main body 111 further includes first and second attachment elements 135, 137 at the opposite ends thereof, in this embodiment cylindrical bush elements, to which the brackets 107, 109 are attached. In this embodiment, as will be described in more detail hereinbelow, the attachment elements 135, 137 are configured to provide for pivoting of the print unit 106 relative to the brackets 107, 109, such as to enable the wiper blades 121, 123 to be aligned parallel to the surface of the printing screen 129 so as to maintain a sealing engagement therewith.

The main body 111 further includes a cam recess 139, in this embodiment at an upper surface thereof, for engagement with a cam member 217 on the support member 105, which is operative to provide for alignment of the print unit 106 relative to the brackets 107, 109 and hence the support member 105.

The print unit 106 further comprises a rotatable unit 141 which is disposed in the lower chamber 114 of the main body 111, such as to extend along the length thereof, and is rotatable to displace the print medium as contained in the lower chamber 114. In this embodiment the rotatable unit 141 is supported in bearings 142, 142, here journal bearings, at the respective ends of the main body 111. As will be described in more detail hereinbelow, the purpose of the rotatable unit 141, in displacing print medium, is two-fold, firstly in applying a horizontal force to the contained print medium which is such as to counteract the horizontal force as applied to the print medium as a consequence of movement of the print unit 106 and thereby optimize the filling of the printing apertures 131 in the printing screen 129, and secondly in stirring the print medium such as to provide the print medium with an even consistency.

The rotatable unit 141 comprises a hollow body member 143 which includes an inner cavity 145 and a plurality of transfer apertures 147 which fluidly connect the inner cavity 145 to an external surface thereof, such as to allow for the transfer of print medium between the inner cavity 145 and the lower chamber 114 of the main body 111.

In this embodiment the body member 143 comprises a perforated cylindrical member, here a mesh including an array of transfer apertures 147, and a central body 151 which extends along the length of the body member 143, in this embodiment as a shaft, such that the inner cavity 145 is an annular cavity, here of circular section.

In one embodiment the transfer apertures 147 can have a regular pattern.

In another embodiment the transfer apertures 147 can have an irregular pattern.

In this embodiment the rotatable unit 141 includes a drive gear arrangement 153, here comprising first and second driven gears 153a, 153b which are coupled to one end of the central body 151, by which the rotatable unit 141 is rotated by the drive unit 110, as will be described in more detail hereinbelow.

In this embodiment the main body 111 includes a charging port 155 through which the print medium cavity 112 is charged with print medium, and a check valve 157 for selectively opening and closing the charging port 155.

In this embodiment the check valve 157 comprises a delivery channel 159 and a plug member 161 which is moveable relative to the delivery channel 159 between a first, closed position, in which the delivery channel 159 is closed and a second, open position, in which the delivery channel 159 is open, such as to allow for charging of the print medium cavity 112 in the main body 111 with print medium.

In this embodiment the plug member 161 includes a pin 163 which constrains the movement of the plug member 161 between the open and closed positions, and also acts to provide an operator with a visible indication as to whether the check valve 157 is open or closed.

In this embodiment the plug member 161 is pneumatically actuated, such as to be movable between the open and closed positions on the application of a pneumatic supply, typically a compressed air supply.

In this embodiment the charging port 155 is permanently connected to the print medium supply 103, but in an alternative embodiment the charging port 155 can be connected to the print medium supply 103 only at the time of charging the print unit 106.

The print unit 106 further comprises a piston assembly 167 which is operative to apply a pressure, in this embodiment a downward pressure, to the print medium as contained in the print medium cavity 112, which downward pressure acts to force print medium to the outlet aperture 113 of the main body 111, in this embodiment as located between the wiper blades 121, 123, and fill the printing apertures 131 in the printing screen 129 as the print unit 106 is moved thereover.

The piston assembly 167 comprises a piston member 169, in this embodiment an elongate member, which is disposed in the upper chamber 115 in the main body 111 such as to extend along the length thereof and be movable vertically therewithin to pressurize the print medium as contained in the print medium cavity 112, and at least one actuator unit 171 for moving the piston member 169 vertically in the upper chamber 115.

In this embodiment the piston assembly 167 comprises a plurality of actuator units 171, here first and second actuator units 171a, 171b which are disposed towards the respective ends of the piston member 169.

In this embodiment the actuator units 171a, 171b comprise pneumatic units which are operable by pneumatic pressure to apply a predeterminable pressure to the print medium as contained in the print medium cavity 112.

In this embodiment the piston member 169 comprises a plurality of seal members 177, which are separated by supporting plates 179, in the manner of a laminated structure.

In this embodiment the piston member 169 includes at least one print medium indicator 183 for providing a visible indication of the amount of print medium as contained by the print medium cavity 112. In this embodiment the piston member 169 includes a plurality of print medium indicators 183a, 183b which extend rearwardly from the piston member 169, such that the extent to which the print medium indicators 183a, 183b extend from the main body 111 indicates the amount of print medium as contained by the print medium cavity 112.

The brackets 107, 109 each comprise a guide slot 191 which is a sliding fit over the support member 105, an arm member 195 which is attached to a respective end of the print unit 106, and a clamp member 199 which is operative to clamp the brackets 107, 109 to the support member 104 at a desired position.

In this embodiment the arm member 195 includes a recess 200, here a part-circular recess, at a lower end thereof, which captively engages the attachment member 135, 137 at the respective end of the main body 111 of the print unit 106. In this embodiment the recess 200 provides for pivoting of the print unit 106 relative to the brackets 107, 109, such as to allow for alignment of the print unit 106 relative to the support member 105 and hence the printing screen 129 over which the screen printing head 101 is to be traversed.

In this embodiment the clamp member 199 comprises a clamping screw which engages one of a plurality of clamping apertures 213 in the support member 105 in dependence upon the desired position of the print unit 106 on the support member 105.

In this embodiment the drive unit 110 comprises a drive motor 203 and a driving gear arrangement 205, here comprising first and second driving gears 205a, 205b, for driving the drive gear arrangement 153 of the rotatable unit 141.

In this embodiment the drive unit 110 is supported by the drive bracket 109, but could be otherwise supported.

The support member 105 comprises a main body 209, in this embodiment an elongate body, which includes a fixing 211, in this embodiment comprising a plurality of fixing apertures, for attaching the support member 105 to the carriage of a screen printing machine, a plurality of mounting apertures 213 to respective ones of which the brackets 107, 109 are attached, and a cam member 215 which engages the cam recess 139 in the main body 111 of the print unit 106, such as to allow for alignment of the same relative to the support member 105.

In this embodiment the mounting apertures 213 are located at predetermined positions, such as to allow for the mounting of print units 106 of different length to the support member 103.

In this embodiment the cam member 215 includes an eccentric cam 217 which engages the cam recess 139 in the main body 111 of the print unit 106 and, when rotated, causes a small angular rotation of the print unit 106 about the attachment elements 135, 137 thereof, such as to allow for angular alignment of the print unit 106 relative to the support member 105 and hence the printing screen 129 over which the print unit 106 is to be traversed, such as to ensure sealing engagement of the wiper members 121, 123 with the surface of the printing screen 129.

The control unit 102 is operative to control the actuators 171a, 171b of the piston assembly 167 in applying a predetermined pressure to the print medium as contained in the print medium cavity 112 in the main body 111 of the print unit 106, and the drive motor 203 to drive the rotatable unit 141 within the print unit 106 at a predetermined speed in one of the clockwise or counter-clockwise senses depending upon the direction of movement of the print unit 106.

Operation of the screen printing system will now be described hereinbelow.

The print medium cavity 112 is charged with print medium, in this embodiment by opening the check valve 157 through the displacement of the plug member 161 to the open position, through the application of a pneumatic pressure, and delivering print medium from the print medium supply 103 into the print medium cavity 112. In one embodiment the rotatable unit 141 is held stationary during the charging of the print medium cavity 112. In another embodiment the rotatable unit 141 can be operated during the charging of the print medium cavity 112, such as to work the print medium and assist in moving the print medium along the print medium cavity 112. Following charging of the print medium cavity 112, the check valve 157 is then closed, in this embodiment through the displacement of the plug member 161 to the closed position by the application of a pneumatic pressure.

The piston assembly 167 is then actuated to apply a predetermined pressure to the print medium as contained in the print medium cavity 112, which pressure, together with a downward force as applied to the screen printing head 101 for providing for sealing engagement of the wiper blades 121, 123 with the printing screen 129, provides for the application of a downward force F1 to the contained print medium, which force F1 acts to fill the printing apertures 131 in the printing screen 129.

In a printing operation, the print unit 106 is moved laterally over the printing screen 129 in a first, printing direction, in this embodiment in the left to right direction as illustrated, and the rotatable unit 141 is rotated at a predetermined speed in one sense, as illustrated in a clockwise sense.

The lateral movement of the print unit 106 acts to apply a first horizontal force F2 in a first direction to the print medium as contained in the print medium cavity 112 of the print unit 106. Absent any other applied force, the downward force F1 and the horizontal force F2 would achieve a resultant force which is inclined to the vertical direction as described hereinabove in relation to the prior art screen printing head, thereby reducing the filling efficiency of the printing apertures 131 in the printing screen 129. In the present invention, however, the rotation of the rotatable unit 141 is such as to apply a second horizontal force F3 to the print medium at the delivery aperture 113 of the main body 111 of the print unit 106 in a second direction, which is opposite to the printing direction and the direction of the first horizontal force F2 and counteracts the first horizontal force F2 as generated by lateral movement of the print unit 106.

Through control of the speed of rotation of the rotatable unit 141 relative to the speed of movement of the print unit 106, the horizontal forces F2, F3 can be matched such as to cancel out one another and thereby provide that the resultant force on the print medium at the delivery aperture 113 of the print unit 106 is only the downward loading force F1. This matching of the horizontal forces F2, F3 is achieved by nominally matching the peripheral speed of the rotatable element 141 to the linear speed of movement of the print unit 106. By providing for the application of only the downward loading force F1 to the print medium, the print medium enters the printing apertures 131 in the printing screen 129 vertically downwardly, as illustrated by arrows B in FIG. 13, thereby optimally filling the printing apertures 131 in the printing screen 129, and enabling printing at much faster rates than with existing screen printing heads and also enabling print medium to be pushed uniformly down through holes in a workpiece, such as plated through holes in a printed circuit board as required by a "Pin-in-Paste" process.

FIGS. 14 to 17 illustrate a modified screen printing head 101 for use in the above-described screen printing system.

This modified screen printing head 101 is quite similar to the above-described screen printing head 101, and thus, in order to avoid unnecessary duplication of description, only the differences will be described in detail, with like reference signs designating like parts.

In this embodiment, as particularly illustrated in FIGS. 16 and 17, the screen printing head 101 further comprises a feed mechanism 233 which has the charging port 155 as the inlet thereof to receive print medium from the print medium supply 103 and is operative to charge the upper chamber 115 of the print medium cavity 112 at spaced locations, here at spaced locations along the length of the upper chamber 115. Differently from the above-described embodiment, the ends of the main body 111 are closed and the check valve 157 is omitted.

In this embodiment the print medium supply 103 is a conventional print medium cartridge which is pressurised to provide a supply of print medium to the feed mechanism 233.

In this embodiment the main body 111 of the print unit 106 includes a plurality of transfer ports 235, here six in number, at spaced locations in the lateral wall of the upper chamber 115 of the print medium cavity 112 which are fluidly connected to the feed mechanism 233 and through which print medium is fed by the feed mechanism 233 into the upper chamber 115. With this configuration, it has been found that uniform filling of the upper chamber 115 of the print medium cavity 112 can be achieved, even for particularly viscous print media.

The feed mechanism 233 comprises an elongate member 237, in this embodiment in the form of a plate, which extends along the length of the lateral wall of the main body 111 adjacent the transfer ports 235 and defines an elongate feed cavity 239 in the main body 111, here a cylindrical channel, which is in fluid communication with each of the transfer ports 235, and a feed element 241, in this embodiment a feed screw, such as an auger screw, which is disposed within the feed cavity 239 and operative, on rotation, to feed print medium through each of the transfer ports 235 in filling the upper chamber 115 of the print medium cavity 112. In this embodiment the feed element 241 is supported in bearings 242, 242, here journal bearings, at the respective ends of the main body 111. In an alternative embodiment the feed cavity 239 could be formed within an integral main body 111, instead of utilizing a separate elongate member 237.

The feed mechanism 233 further comprises a drive unit 243 for driving the feed element 241 to charge the upper chamber 115 of the print medium cavity 112.

In this embodiment the drive unit 243 comprises a drive motor 245 and a gear arrangement 247 which couples the drive motor 245 to the feed element 241.

Further, in this embodiment, as illustrated in FIGS. 16 and 17, and differently from the above-described embodiment, the piston member 169 includes a single seal member 251, in the form of lip seal, which is fixed by a supporting plate 253.

Finally, it will be understood that the present invention has been described in its preferred embodiments and can be modified in many different ways without departing from the scope of the invention as defined by the appended claims.

The invention claimed is:

1. A screen printing head which, in a printing operation, is displaceable in a first direction over a surface of a workpiece to print deposits of a print medium on the workpiece, the screen printing head comprising:
 a print head assembly comprising a print unit comprising a main body including a print medium cavity, which in use contains a print medium, and a delivery aperture, which is in fluid communication with the print medium cavity and through which print medium is in use delivered from the print medium cavity to the surface of the workpiece, and a rotatable unit which is disposed in the print medium cavity of the main body and rotatable to displace print medium as contained in the print medium cavity, wherein the rotatable unit comprises a hollow body member which includes an inner cavity and a plurality of transfer apertures which fluidly connect the inner cavity with the print medium cavity; and
 a drive unit for rotating the rotatable unit such as to displace print medium as contained in the print medium cavity, wherein, during displacement of the screen printing head in the first direction in the printing operation, the drive unit rotates the rotatable unit to apply a force to the print medium at the delivery aperture in the main body in a second direction which is opposite to the first direction of displacement of the screen printing head.

2. The screen printing head of claim 1, wherein the print medium cavity comprises a first chamber which opens to the delivery aperture and in which the rotatable unit is disposed, and a second chamber which is fluidly connected to the first chamber, such as to allow for print medium to be supplied from the second chamber to the first chamber.

3. The screen printing head of claim 2, wherein the first chamber includes an upper surface of arcuate section or part-circular section.

4. The screen printing head of claim 1, wherein the body member includes a perforated cylindrical member or a mesh which includes an array of transfer apertures over the surface thereof.

5. The screen printing head of claim 4, wherein the body member includes a central body which extends internally within the cylindrical member, such that the inner cavity is an annular cavity.

6. The screen printing head of claim 1, wherein the print unit further comprises a pressure application unit which is operative to apply a pressure to the print medium as contained in the print medium cavity.

7. The screen printing head of claim 1, wherein the rotatable unit is rotated at such a speed that the force as applied to the print medium at the delivery aperture in the main body in the second direction is substantially equal to a force as applied to the print medium by displacement of the screen printing head in the first direction.

8. The screen printing head of claim 1, wherein the print head assembly comprises at least one support bracket which is attached to the print unit and by which the print head assembly is mounted to a screen printing machine, and the print unit is pivotally coupled to the at least one support bracket, such as to allow for alignment of the print unit.

9. The screen printing head of claim 1, further comprising:
 a mounting frame to which the print head assembly is mounted, and the mounting frame includes a fixing for attaching the mounting frame to a carriage of a screen printing machine.

10. The screen printing head of claim 9, wherein the mounting frame includes an alignment member or cam member which is operative to engage the print unit such as to provide for alignment of the same relative to the mounting frame.

11. The screen printing head of claim 1, wherein the print medium cavity comprises an elongate cavity, and further comprising:
 a feed mechanism which is operative to charge the print medium cavity at spaced locations.

12. The screen printing head of claim 11, wherein the main body includes a plurality of transfer ports which open at spaced locations into the print medium cavity and are fluidly connected to the feed mechanism, and the main body includes an elongate feed cavity which is in fluid communication with the transfer ports and the feed mechanism comprises a feed element or feed screw which is disposed in the feed cavity and operative to feed print medium through the transfer ports in filling the print medium cavity.

13. A screen printing head system, comprising:
 the screen printing head of claim 1; and
 a control unit for controlling the drive unit such as to rotate the rotatable unit at a predeterminable speed.

14. A method of printing deposits of a print medium on a workpiece using a screen printing head, the method comprising the steps of:
 providing a screen printing head which comprises a print head assembly, the print head assembly comprising a print unit which comprises a main body including a print medium cavity and a delivery aperture, which is in fluid communication with the print medium cavity, and a rotatable unit which is disposed in the print medium cavity of the main body and rotatable to displace print medium as contained in the print medium cavity, wherein the rotatable unit comprises a hollow body member which includes an inner cavity and a plurality of transfer apertures which fluidly connect the inner cavity with the print medium cavity;
 displacing the screen printing head in a first direction over a workpiece in a printing operation; and
 rotating the rotatable unit such as to displace print medium as contained in the print medium cavity, wherein, during displacement of the screen printing head in the first direction in the printing operation, the rotatable unit is rotated such as to apply a force to the print medium at the delivery aperture in a second direction which is opposite to the first direction of displacement of the screen printing head.

15. The method of claim 14, wherein the print medium cavity comprises a first chamber which opens to the delivery aperture and in which the rotatable unit is disposed, and a second chamber which is fluidly connected to the first chamber, such as to allow for print medium to be supplied from the second chamber to the first chamber.

16. The method of claim 15, wherein the first chamber includes an upper surface of arcuate section or part-circular section.

17. The method of claim 14, wherein the body member includes a perforated cylindrical member or a mesh which includes an array of transfer apertures over the surface thereof.

18. The method of claim 17, wherein the body member includes a central body which extends internally within the cylindrical member, such that the inner cavity is an annular cavity.

19. The method of claim 14, further comprising the step of:
charging the print medium cavity with print medium.

20. The method of claim 19, wherein the rotatable unit is stationary during the step of charging the print medium cavity.

21. The method of claim 19, wherein the rotatable unit is rotated during the step of charging the print medium cavity.

22. The method of claim 14, further comprising the step of:
applying a pressure to the print medium as contained in the print medium cavity.

23. The method of claim 14, wherein the rotatable unit is rotated at such a speed that the force as applied to the print medium at the delivery aperture in the main body in the second direction is substantially equal to a force as applied to the print medium by displacement of the screen printing head in the first direction.

24. The method of claim 14, wherein the print head assembly comprises at least one support bracket which is attached to the print unit and by which the print head assembly is mounted to a screen printing machine, and the print unit is pivotally coupled to the at least one support bracket and further comprising the step of:
pivoting the print unit to the at least one support bracket, such as to align the print unit.

25. The method of claim 14, wherein the screen printing head further comprises a mounting frame to which the print head assembly is mounted, and the mounting frame includes a fixing for attaching the mounting frame to a carriage of a screen printing machine.

26. The method of claim 25, wherein the mounting frame includes an alignment member or cam member which is operative to engage the print unit such as to provide for alignment of the same relative to the mounting frame.

27. The method of claim 14, wherein the print medium cavity comprises an elongate cavity, and the print head assembly further comprises a feed mechanism which is operative to charge the print medium cavity with print medium at spaced locations, and further comprising the step of:
operating the feed mechanism to charge the print medium cavity with print medium at spaced locations.

28. The method of claim 27, wherein the main body includes a plurality of transfer ports which open at spaced locations into the print medium cavity and are fluidly connected to the feed mechanism, and the main body includes an elongate feed cavity which is in fluid communication with the transfer ports and the feed mechanism comprises a feed element or feed screw which is disposed in the feed cavity and operative to feed print medium through the transfer ports in filling the print medium cavity.

\* \* \* \* \*

UNITED STATES PATENT AND TRADEMARK OFFICE
CERTIFICATE OF CORRECTION

PATENT NO.        : 8,371,217 B2                                    Page 1 of 1
APPLICATION NO.   : 12/296768
DATED             : February 12, 2013
INVENTOR(S)       : Andrew Edmonds It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1070 days.

Signed and Sealed this
First Day of September, 2015

Michelle K. Lee
*Director of the United States Patent and Trademark Office*